United States Patent [19]

Einthoven

[11] Patent Number: 4,859,621

[45] Date of Patent: Aug. 22, 1989

[54] METHOD FOR SETTING THE THRESHOLD VOLTAGE OF A VERTICAL POWER MOSFET

[75] Inventor: Willem G. Einthoven, Belle Meade, N.J.

[73] Assignee: General Instrument Corp., New York, N.Y.

[21] Appl. No.: 150,755

[22] Filed: Feb. 1, 1988

[51] Int. Cl.[4] .......................................... H01L 21/22
[52] U.S. Cl. ........................................ 437/45; 437/38; 437/203; 437/228; 148/DIG. 126; 148/DIG. 168; 148/DIG. 51
[58] Field of Search ................ 357/23.4, 41, 55; 437/203, 38; 43/45, 228; 148/DIG. 168, DIG. 126, DIG. 51

[56] References Cited

U.S. PATENT DOCUMENTS

| | | | |
|---|---|---|---|
| 4,200,968 | 5/1980 | Schroeder | 437/38 |
| 4,206,005 | 6/1980 | Yeh et al. | 437/45 |
| 4,272,302 | 6/1981 | Jhabuala | 357/55 |
| 4,296,429 | 10/1981 | Schroeder | 357/55 |
| 4,374,455 | 2/1983 | Goodman | 437/38 |
| 4,503,449 | 3/1985 | David et al. | 357/23.4 |
| 4,612,465 | 9/1986 | Schutten et al. | 357/23.4 |
| 4,697,201 | 9/1987 | Mihara | 357/55 |

FOREIGN PATENT DOCUMENTS 0016379  1/1984  Japan ...................................... 437/45

Primary Examiner—Brian E. Hearn
Assistant Examiner—Tom Thomas
Attorney, Agent, or Firm—James & Franklin

[57] ABSTRACT

A wafer with a <100> orientation comprises a strongly doped N layer (substrate), a lightly doped N layer (middle layer) and a lightly doped P layer (top layer). A strongly doped N layer (source layer) is diffused into most of the top layer. An oxide layer is grown. A V groove with a flat bottom is anisotropically etched through openings in the oxide layer. The V groove is etched through the source layer and most of the P layer. The bottom of the groove initially is at a level above the junction between the top layer and the middle layer. Exposure to beam of phosphorous ions forms a shallow implanted channel region proximate the walls of the groove. An unwanted implanted region along the bottom of the groove is also formed. A second anisotropic etch, through the same oxide mask, deepens the groove bottom to a point below the junction, removing the unwanted portion of the implanted region along the groove bottom. The implanted concentration of the channel is later reduced as the gate oxide is formed. This method of groove formation can be used to set the threshold voltage of enhancement mode power MOSFETS, without comprising the breakdown voltage. It can also be used to produce depletion mode power MOSFETS with zero-gate on resistance values of a few MILLI-OHM CM[2].

16 Claims, 1 Drawing Sheet

METHOD FOR SETTING THE THRESHOLD VOLTAGE OF A VERTICAL POWER MOSFET

The present invention relates to a method fabricating metal oxide semiconductor field effect transistors (MOSFETs) and, more particularly, to a method for setting the threshold voltage of a vertical power MOSFET by implanting the channel region in a unique manner. The method permits the accurate setting of the threshold voltage without comprising the breakdown voltage. The method also permits the fabrication of depletion mode power MOSFETs.

A commercial process for fabricating enhancement mode power MOSFETs of the "V" groove type is known. It does not, however, lend itself to the accurate setting of the threshold voltage of the device because other parameters are sacrificed as the threshold is set. No commercial method for fabricating depletion mode MOSFETs is known. The processes which are known are too expensive to be practical for mass production.

In the known process for fabricating enhancement mode power MOSFET devices, a substantially flat bottomed "V" groove is etched through an implanted surface region. The bottom of the groove is situated at a point below the junction between upper and lower opposite conductivity type portions of the epitaxial layer. An insulating layer is then formed over the walls and bottom of the groove, a gate electrode is deposited and metal contacts formed. This method does not permit accurate setting of the threshold voltage because the channel region cannot be implanted to obtain a precise impurity concentration without comprising other parameters.

Implanting the channel region which is proximate the groove wall, results in the region proximate the bottom of the groove being implanted as well. This unwanted implanted region, which is below the junction, degrades the breakdown voltage of the junction. Hence, implantation was avoided altogether and other means of setting the threshold voltage were attempted.

The present invention is directed to a method for setting the threshold voltage in a vertical power MOSFET which will permit the accurate setting of the threshold voltage without compromising other parameters. The threshold voltage may be set as desired, resulting in enhancement mode or depletion mode vertical power MOSFETs.

The process involves the formation of a "V" groove. A first anisotropic etch is performed through an oxide mask in a substrate with a <100> crystal orientation. The oxide mask is not removed. The substrate is exposed to an ion beam so as to create an implanted channel region proximate the walls. The beam also creates an unwanted implanted region along the bottom of the groove. Thereafter, the unwanted implanted region proximate the bottom of the groove is removed by a second anisotropic etch so as not to adversely affect other parameters such as the breakdown voltage. The second anisotropic etch is performed through the same oxide mask to insure perfect self-alignment.

Due to the diffused character of the P-N junction, the limit of the implant close to the junction is not very critical. The second etch deepens the bottom of the groove to a level below the junction. The remainder of the process is conventional, including the formation of a gate insulation layer, such as silicon dioxide, through a growth process which also reduces the ion concentration of the remaining implanted region.

By controlling the ion concentration of the implanted channel region, the threshold voltage can be accurately set. Removal of the unwanted bottom region eliminates any compromise of the other parameters of the device due to the channel implant. The implant dose is relatively light such that the silicon crystal does not become amorphous. The walls of the groove are thus barely damaged by the implant and will still slow down an anisotropical etch.

It is, therefore, a prime object of the present invention to provide a method for the setting of the threshold voltage of a vertical MOSFET without compromising the other parameters thereof.

It is, therefore, another object of the present invention to provide a method for setting the threshold voltage of a power MOSFET to be either a depletion mode device or an enhancement mode device.

It is another object of the present invention to provide a method for setting the threshold voltage of a power MOSFETs which utilizes a single oxide mask for two etching steps to insure perfect self-alignment.

It is another object of the present invention to provide a method for setting the threshold voltage of a power MOSFETs which includes two anisotropical etches performed on a substrate with a <100> crystal orientation.

It is still another object of the present invention to provide a method for setting the threshold of a power MOSFETs where the second etch process removes the implanted region proximate the bottom of the groove so as to increase the breakdown voltage of the device to the pre-implant level.

In accordance with the present invention, a method for setting the threshold voltage of a power MOSFET is provided. The method begins with a substrate with a <100> crystal orientation. The substrate has a top layer of a first conductivity type, a middle layer of relatively lightly doped second conductivity type and a bottom layer of relatively heavily doped second conductivity type. The top and middle layers form a junction at least a portion of which is parallel to the substrate surface.

A region of the second conductivity type is formed at the substrate surface resulting in a second junction. The substrate is anisotropically etched through the surface region and into the top layer to form a groove. The bottom of the groove is initially above the first junction.

The substrate is then exposed to a beam of ions of the second conductivity determining type so as to form an implanted channel region proximate the walls of the groove. An unwanted implanted region along the bottom of the groove is also formed. The substrate is anisotropically etched a second time to remove the unwanted portion of the implanted layer along the bottom of the groove. The level of the groove bottom is now within the middle layer, below the junction.

Fabrication of the MOSFET is completed by any one of a number of conventional processes which include formation of a gate insulation layer, a gate and contacts. The insulation layer below the gate is preferably formed through oxide growth. Although it is not desirable, the oxide growth also reduces the ion concentration in the remaining implanted region.

An oxide layer, formed on the substrate surface prior to the etch step, has an opening formed therein. This layer is used as a mask for both etches, insuring accurate self-alignment.

In some cases, the concentration of the ions in the implanted channel region is sufficient to change the conductivity type of the channel region. The step where the gate insulation oxide layer is grown results in a reduction of the concentration of the implanted channel region and may change the region back to its original conductivity type.

The ion beam is directed in a direction substantially perpendicular to the substrate surface. An energy of approximately 150 kev is preferable for a phosphorus implant. With this type of implant, a concentration in the range of $3\times10^{12}$ to $5\times10^{12}$ ions/cm$^2$ is preferable for an enhancement device and in the range of $8\times10^{12}$ to $9\times10^{12}$ ions/cm$^2$ for a depletion mode device.

To these and to such other objects which may hereinafter appear, the present invention relates to a method for setting the threshold voltage in a power MOSFET, as set forth in detail in the following specification and recited in the annexed claims, taken together with the accompanying drawings, where like numerals refer to like parts and in which:

Figure 1:
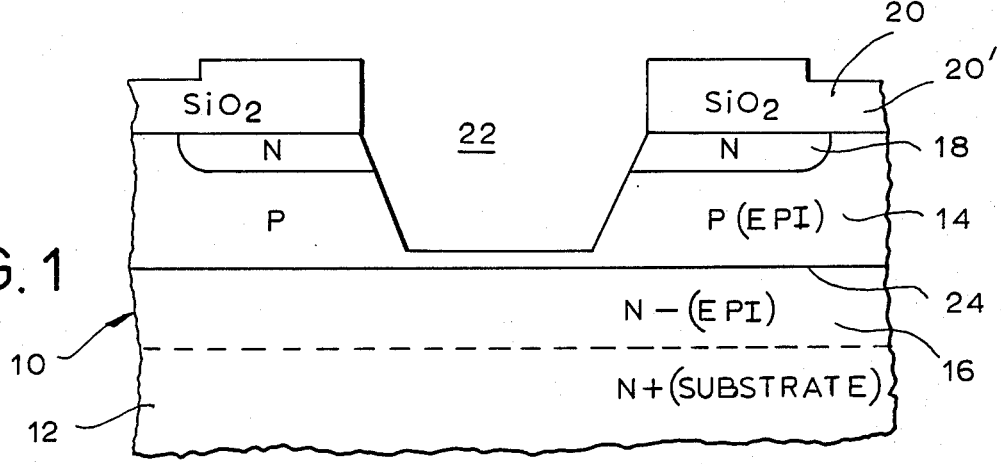
FIG. 1 is a cross-sectional view of an idealized semiconductor substrate at the initial stage of the "V" groove formation process illustrating the present invention as it would be used to fabricate a depletion mode power MOSFET.

As noted above, the threshold setting process of the present invention can be used to fabricate both enhancement mode and depletion mode power MOSFETs. For purposes of illustration, the following description relates to a preferred embodiment of the method as used in a process to fabricate depletion mode devices which utilize a phosphorus implant. Implant energies and concentrations are provided accordingly. It is well within the ordinary skill in the art to understand and calculate implantation energies and concentrations which would be required for different type implants, such as arsenic. It is also within the skill in the art to determine the appropriate concentrations for enhancement mode devices with different threshold voltages.

The fabrication process starts with an epitaxial wafer, generally designated 10, with a <100> crystal orientation. Wafer 10 includes a relatively heavily doped N+ bottom layer 12 which is formed an epitaxial layer. The epitaxial layer has a top P type region 14 and a relatively lightly doped N-type middle layer 16 so as to form a P-N junction 24 substantially parallel to the substrate surface.

After a nitride deposition, a first photoresist layer is situated on the surface of the wafer and first mask is placed thereon having opaque portions coinciding with the position of an N type surface layer 18 to be formed. The unit is exposed to light, which hardens the exposed portion of the photoresist. The mask is removed and the uncured portions of the photoresist are washed away. An arsenic implantation is then performed followed by an arsenic drive step. Locos oxidation then takes place of the arsenic implanted regions forming a layer 20. Next, the nitride layer is removed. Then a boron deposition takes place, followed by a boron drive step.

Next, an oxidation step forms a silicon dioxide layer 20' on the surface of the substrate where the nitride was removed. During this oxidation step, layer 20 grows in thickness. A second layer of photoresist is coated on the surface and a second mask placed thereover with opaque portions aligned with the N type regions 18 where the "V" grooves are to be formed. The photoresist is developed, the mask removed and the uncured photoresist washed away. An opening in oxide layer 20 is formed and the remaining photoresist is removed.

At this point, the initial "V" groove anisotropical etch takes place as the etching chemical is coated on the wafer so as to form a groove 22 having walls substantially in the <111> plane and a relatively flat bottom which is initially located slightly above a junction 24 between regions 14 and 16. The substrate now appears as shown in FIG. 1. It should be noted at this point that groove 22 is etched to a depth less than the final required depth. The oxide layer 20', used as an etch mask, is preserved for reuse.

Figure 2:
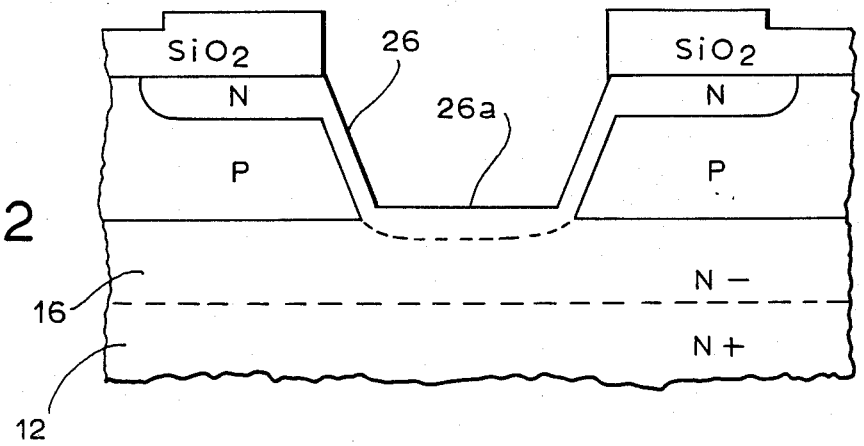
FIG. 2 illustrates an intermediate step in the "V" groove formation process.

As shown in FIG. 2, the next step is the phosphorus implant, the phosphorus ions being beamed in a direction perpendicular or nearly perpendicular to the surface of the wafer. The implant dosage is rather light, approximately in the range of $8\times10^{12}$ ions/cm$^2$ to $9\times10^{12}$ ions/cm$^2$ at 150 kev. The dose will change the conductivity type of the implanted region to N type. The implant dose is so light that the silicon crystal does not become amorphous. The sides of the "V" groove are barely damaged and will still slow down the subsequent anisotropical etch.

Figure 3:
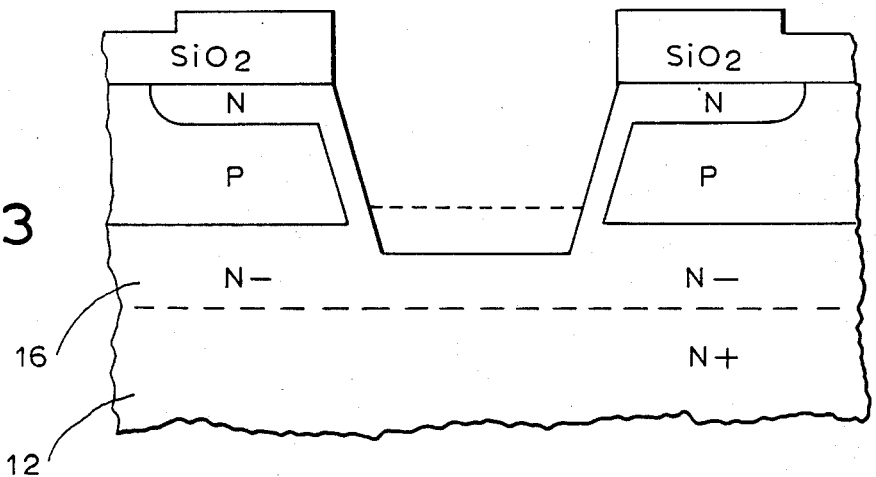
FIG. 3 illustrates the final step in the "V" groove formation process.

After the phosphorus implant, the substrate appears as shown in FIG. 2. The implanted region 26 extends proximate the walls of the groove, forming the channel region, and along bottom of groove 22 forming region 26a. Region 26a, along the bottom of groove 22, extends into region 16 and hence would affect the characteristics, and particularly reduce the breakdown voltage, of the device. In order to preserve the original breakdown voltage, region 26a must be removed. Due to the diffused character of P-N junction 24, the limit of the N implant close to junction 24 is not overly critical. Region 26a is removed by an additional anisotropical etching step, as illustrated in FIG. 3, such that the bottom of the "V" groove is now at the required depth. The walls of the groove, and hence the channel region is not substantially affected.

Figure 4:
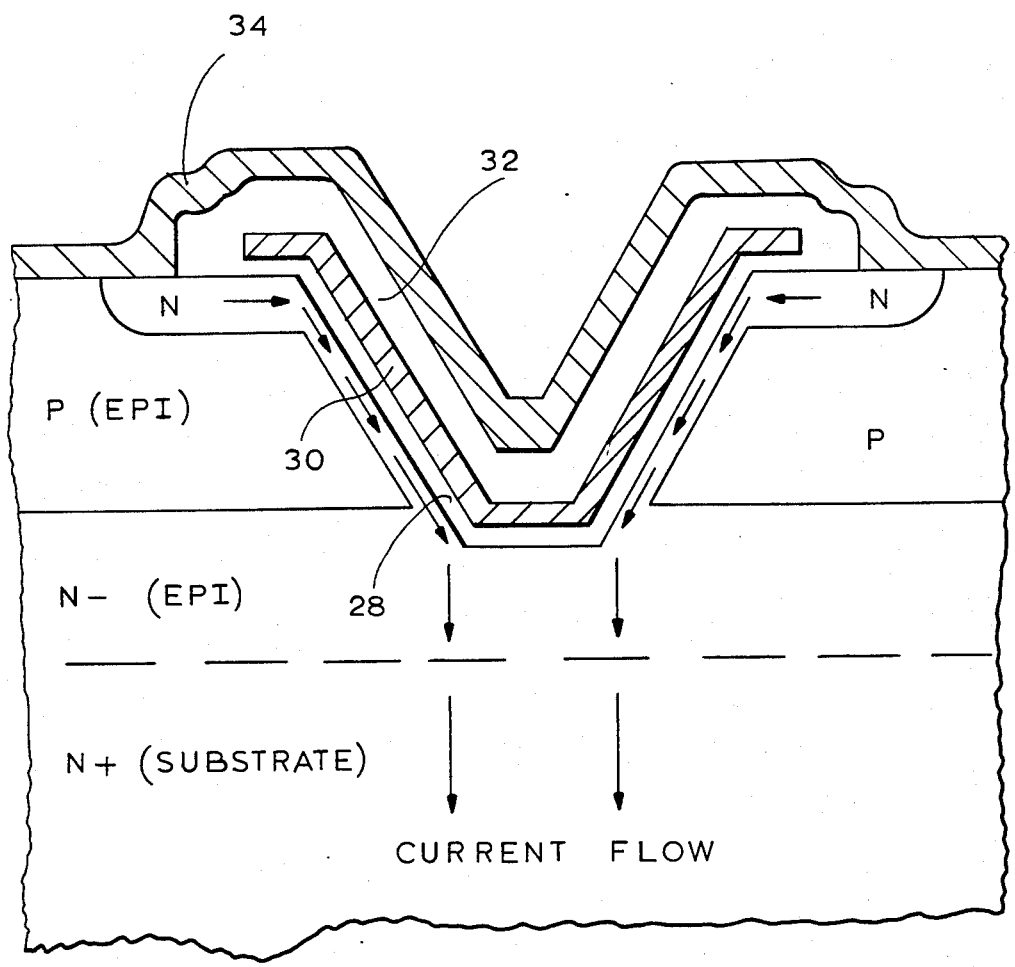
FIG. 4 shows a completed depletion mode device in accordance with the present invention.

After the second etching step, a gate insulation layer in the form of oxide layer 28 is grown. The oxide growth results in a reduction of the ion concentration in the channel region. The reduction of the concentration may result in the channel region returning to its original conductivity type, depending upon the concentration originally implanted. A layer of polysilicon 30 is then deposed on oxide layer 28, as seen in FIG. 4. Next, the back of the substrate (not shown) is stripped. The polysilicon 30 is doped to form the gate. A third layer of photoresist is then placed on the substrate and a third mask, delineating the polysilicon, is situated over the photoresist. The photoresist is developed and the mask is removed. The polysilicon layer is etched and the third layer of photoresist removed. The polysilicon oxide layer 32 is then formed.

As is conventional with this type of process, a fourth layer of photoresist is then coated on the surface of the wafer and a fourth mask delineating the first contact is situated thereon. Contact doping takes place, the fourth layer of photoresist is removed, and the phosphorus silicon glass deposition takes place. Thereafter, a fifth layer of photoresist is coated on the surface of the wafer and a fifth mask with an opening aligned with the second contact is placed thereon. The deposition of an aluminum layer 34 then takes place and the photoresist is removed. The last layer of photoresist is then placed on the surface of the wafer and a last mask delineating the metal layer is provided. The metal layer is then sintered. Lastly, a Ti/Ni/Au deposition is performed on the undersurface of the wafer (not shown).

The above preocess steps for completing the MOSFET after the "V" is formed are illustrative of one of several conventional processes which are known to achieve the desired results. However, conventional processes other than that described may be used with equal results. These steps should not be considered part of the present invention or a limitation thereon.

It will now be appreciated that the present invention relates to a method for setting the threshold voltage of a vertical transistor in which the "V" groove is formed by a three-step process. The groove formation process includes an initial anisotropic etching step which forms a "V" groove with a bottom at a level less than the required depth, followed by an ion implant. After the ion implant, an additional anisotropic etch step is performed so as to increase the depth of the groove to the required depth and to remove the implanted region below the groove bottom. In this manner, the threshold voltage of a vertical device can be set accurately without reducing the breakdown voltage or adversely affecting other parameters.

While only a single preferred embodiment of the present invention has been disclosed herein for purposes of illustration, it is obvious that many variations and modifications could be made thereto. It is intended to cover all of these variations and modifications which fall within the scope of the present invention, as defined by the following claims:

I claim:

1. A method for setting the threshold of a MOSFET formed on a substrate with a <100> crystal orientation and a top layer of a first conductivity tape, a middle layer of a lightly doped second conductivity type and a bottom layer of a relatively heavily doped second conductivity type, the top and middle layers forming a junction at least a portion of which is substantially parallel to the substrate surface, comprising the steps of: forming a second conductivity type region proximate the substrate surface; anisotropically etching a groove with a substantially flat bottom through the surface region and into the top layer, the bottom of the groove initially being above the junction; exposing the substrate to a beam of ions of the second conductivity determining type so as to form an implanted region proximate the walls and bottom of the groove, said implanted region being substantially continuous and extending below said junction; and anisotropically etching the substrate a second time to remove the portion of the implanted region proximate the groove bottom such that the final level of the groove bottom is within the middle layer below the junction and said implanted region operably connects said surface region with said middle layer.

2. The method of claim 1 further comprising the steps of forming a gate insulation layer over the walls and bottom of the groove, forming a gate insulation layer and forming the metal contacts.

3. The method of claim 1 wherein the step of etching the substrate comprises the steps of forming an oxide layer on the substrate surface, opening a hole in the oxide layer to expose a portion of the substrate surface where the groove will be formed and applying the etching composition to the substrate surface.

4. The method of claim 3 wherein the step of etching a second time comprises the step of utilizing the previously formed oxide layer as a mask for the second etch and applying the etching composition to the substrate surface.

5. The method of claim 3 wherein the oxide layer is not removed until after the second etch is performed.

6. The method of claim 1 wherein the step of exposing the substrate to a beam of ions comprises the step of implanting a concentration of ions sufficient to cause the implanted region to change conductivity.

7. The method of claim 6 further comprising the step of growing a gate oxide and wherein the growth of the oxide layer reduces the ion concentration in the implanted region.

8. The method of claim 7 wherein reducing the ion concentration of the implanted region causes same to return to its original conductivity type.

9. The method of claim 1 wherein the step of exposing the substrate comprises the step of directing an ion beam in a direction substantially perpendicular to the substrate surface.

10. The method of claim 1 wherein the step of exposing the substrate comprises the step of implanting phosphorus ions at approximately 150 kev.

11. The method of claim 1 wherein the step of exposing the substrate comprises the step of implanting phosphorus ions at approximately 150 kev at a concentration in the range of $3 \times 10^{12}$ to $5 \times 10^{12}$.

12. The method of claim 1 wherein the step of exposing the substrate comprises the step of implanting phosphorus ions at approximately 150 kev at a concentration in the range of $8 \times 10^{12}$ to $9 \times 10^{12}$ ions/cm$^2$.

13. The method of claim 1 wherein said surface region comprises the source of the MOSFET.

14. The method of claim 1 wherein said middle layer and said bottom layer comprise the drain of the MOSFET.

15. The method of claim 1 wherein said implanted region comprises the channel of said MOSFET.

16. The method of claim 1 where the step of exposing the substrate to a beam of ions comprises the step of directing the ions substantially perpendicular to the substrate surface.

* * * * *